United States Patent
Lee et al.

(10) Patent No.: US 9,542,978 B2
(45) Date of Patent: Jan. 10, 2017

(54) SEMICONDUCTOR PACKAGE WITH TERMINALS ADJACENT SIDES AND CORNERS

(71) Applicant: Samsung Electronics Co., Ltd., Suwon-si, Gyeonggi-do (KR)

(72) Inventors: Jong-won Lee, Seoul (KR); Jang-mee Seo, Seoul (KR); In-won O, Jeonju-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/729,042

(22) Filed: Jun. 2, 2015

(65) Prior Publication Data
US 2016/0049176 A1 Feb. 18, 2016

(30) Foreign Application Priority Data
Aug. 14, 2014 (KR) .................. 10-2014-0106223

(51) Int. Cl.
*G11C 5/02* (2006.01)
*G11C 5/06* (2006.01)

(52) U.S. Cl.
CPC ............... *G11C 5/025* (2013.01); *G11C 5/063* (2013.01); *H01L 2924/15192* (2013.01)

(58) Field of Classification Search
CPC ................................. G11C 5/025; G11C 5/063
See application file for complete search history.

(56) References Cited

U.S. PATENT DOCUMENTS

| 5,642,323 A | * | 6/1997 | Kotani | G11C 5/025 365/230.03 |
| 5,966,316 A | * | 10/1999 | Tsukikawa | G11C 5/025 365/230.03 |
| 6,072,743 A | * | 6/2000 | Amano | G11C 5/025 365/230.03 |
| 6,078,514 A | | 6/2000 | Takemae et al. | |
| 6,492,727 B2 | | 12/2002 | Nishizawa et al. | |
| 7,745,915 B2 | | 6/2010 | Suwa et al. | |
| 7,990,798 B2 | * | 8/2011 | Minzoni | G11C 7/10 365/230.02 |
| 7,994,623 B2 | | 8/2011 | Nonomura et al. | |

(Continued)

FOREIGN PATENT DOCUMENTS

JP 2007036245 A 2/2007
KR 20090022774 A 3/2009

*Primary Examiner* — Khamdan Alrobaie
(74) *Attorney, Agent, or Firm* — Renaissance IP Law Group LLP (57) ABSTRACT

A semiconductor package includes: a plurality of memory packages which are arranged on a substrate; and a logic chip, which has a rhombus shape including first through fourth corners and first through fourth sides connecting the first through fourth corners, is arranged adjacent to the plurality of memory packages, and includes a plurality of terminals that are electrically connected to the plurality of memory packages, as seen on a plan view of the semiconductor package, wherein the plurality of terminals include system address terminals which are adjacent to the first corner of the logic chip and first and second system data terminals which are respectively arranged on the first and second sides contacting the first corner. Another semiconductor package and a method of fabrication are disclosed.

15 Claims, 8 Drawing Sheets

(56) References Cited

U.S. PATENT DOCUMENTS

| | | |
|---|---|---|
| 8,180,939 B2 | 5/2012 | Kim et al. |
| 8,183,688 B2 | 5/2012 | Yoshikawa et al. |
| 8,237,267 B2 | 8/2012 | Shinohara |
| 2006/0186555 A1* | 8/2006 | Son .................... B82Y 10/00 257/786 |
| 2006/0244130 A1* | 11/2006 | Yeh ................ H01L 23/49575 257/723 |
| 2012/0133055 A1 | 5/2012 | Machida |
| 2013/0043584 A1 | 2/2013 | Kwon et al. |

\* cited by examiner

SEMICONDUCTOR PACKAGE WITH TERMINALS ADJACENT SIDES AND CORNERS

CROSS-REFERENCE TO RELATED APPLICATION

This application claims the benefit of Korean Patent Application No. 10-2014-0106223, filed on Aug. 14, 2014, in the Korean Intellectual Property Office, the disclosure of which is incorporated herein in its entirety by reference.

BACKGROUND

The inventive concept relates to a semiconductor package, and more particularly, to a semiconductor package including a plurality of semiconductor chips.

SUMMARY

A semiconductor package may include a logic chip which controls or operates a system of an electronic device or controls a memory chip, a memory chip which stores information, or the like. The logic chip may store data in the memory chip or may use the data stored in the memory chip. With the development of semiconductor manufacturing technology, there is a requirement for a miniature semiconductor package and a semiconductor package which may quickly process data.

Disclosed herein is a semiconductor package which enables high-speed data transmission between a logic chip and a memory chip in order to reduce package size and improve performance.

Figure 1:
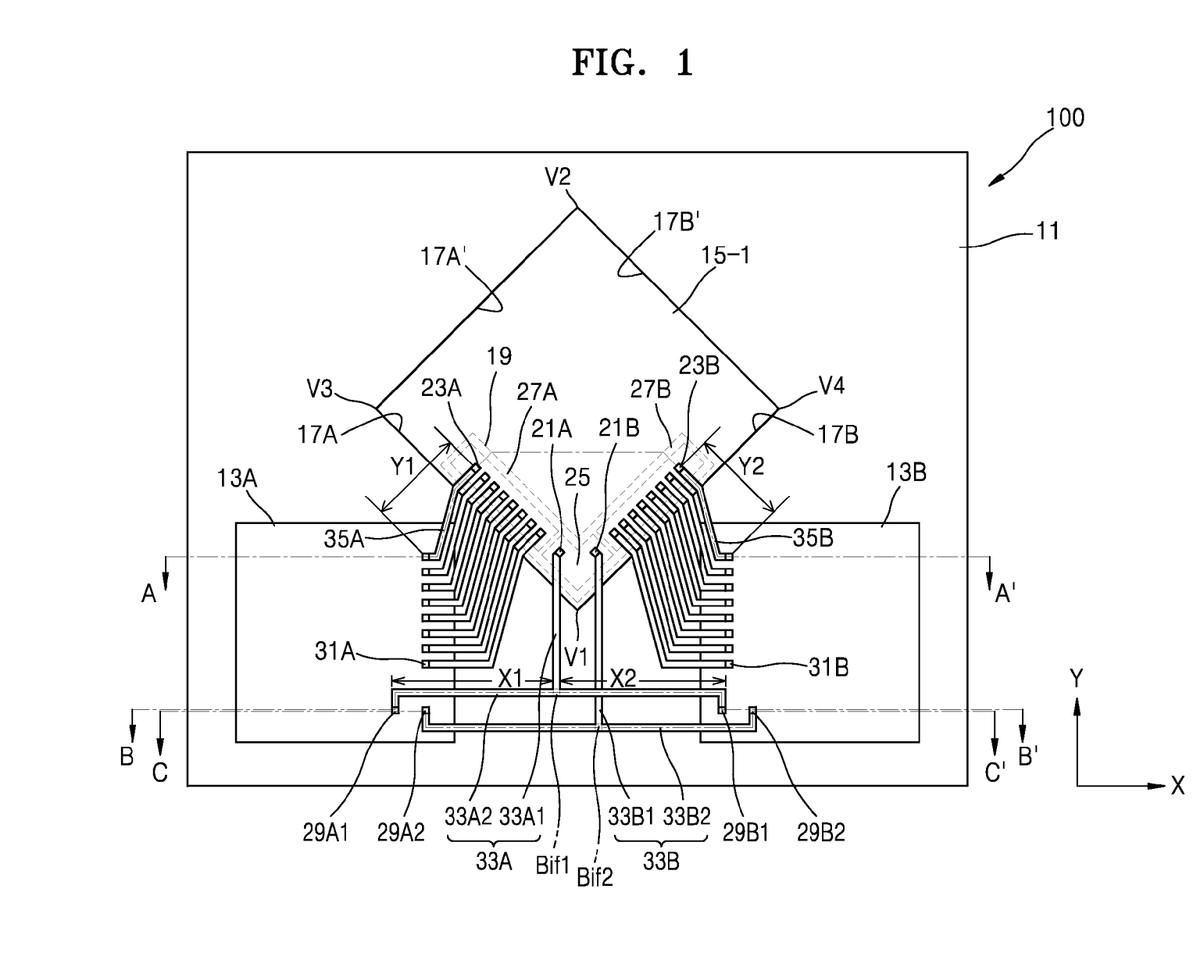
FIG. 1 is a plan layout of a semiconductor package according to some exemplary embodiments.

In one embodiment, a semiconductor package is disclosed and includes: a plurality of memory packages which are arranged on a substrate; and a logic chip, which has a rhombus shape including first through fourth corners and first through fourth sides connecting the first through fourth corners, is arranged adjacent to the plurality of memory packages, and includes a plurality of terminals that are electrically connected to the plurality of memory packages (see, for example, FIG. 1). The plurality of terminals include system address terminals which are adjacent to the first corner of the logic chip and first system data terminals and second system data terminals which are respectively arranged on the first and second sides contacting the first corner.

The system address terminals may be arranged in a first system address terminal area adjacent to the first corner of the logic chip, the first system data terminals may be arranged in a first system data terminal area adjacent to the first side, and the second system data terminals may be arranged in a second system data terminal area adjacent to the second side.

The plurality of memory packages may include first memory package and second memory package, and each of the first memory package and the second memory package may include first memory address terminals and second memory address terminals as well as memory data terminals.

The first memory package may be adjacent to the first system data terminal area of the logic chip, the second memory package may be adjacent to the second system data terminal area of the logic chip, and the logic chip may be arranged such that the first corner of the logic chip is disposed between the first memory package and the second memory package.

The system address terminals of the logic chip may include a first system address terminal and a second system address terminal and may further include: a first address line which connects the first system address terminal to the first memory address terminal of the first memory package and the first memory address terminal of the second memory package; and a second address line which connects the second system address terminal to the second memory address terminal of the first memory package and the second memory address terminal of the second memory package.

Each of the first and second address lines may be arranged in the substrate and may include a common line, which is connected to each of the first and second system address terminals, and branch lines which branch from each common line and extend toward the first and second memory packages.

A length of the first address line may be substantially the same as that of the second address line.

First data lines, which connect the first system data terminals and the memory data terminals of the first memory package, and second data lines, which connect the second system data terminals and the memory data terminals of the second memory package, may be symmetrically arranged about a center of a distance between the first and second memory packages.

A length of each first data line may be the same as that of each second data line which symmetrically corresponds to each first data line.

The semiconductor package may further include: a second system address terminal area which includes third system address terminals and fourth system address terminals adjacent to second corner of the logic chip. The second corner may face the first corner and may contact the third and fourth sides; a third system data terminal area which includes third system data terminals arranged adjacent to the third side; and a fourth system data terminal area which includes fourth system data terminals arranged adjacent to the fourth side.

The plurality of memory packages may further include third and fourth memory packages which face the first and second memory packages and are arranged on the substrate, and the logic chip may be arranged such that the second corner of the logic chip is disposed between the third and fourth memory packages.

In another embodiment, there is provided a semiconductor package including: a substrate; a plurality of memory packages which are arranged on the substrate and respectively include corners and sides connecting the corners; and a logic chip, which is arranged adjacent to the plurality of memory packages on the substrate, includes corners and sides connecting the corners, and includes a plurality of terminals that are electrically connected to the plurality of memory packages. The sides of the logic chip extend in different directions from directions of the sides of the plurality of memory packages. The plurality of terminals of the logic chip include data terminals, via which signals inputting/outputting logic data pass, and an address terminal via which signals designating addresses of the data pass, and the data terminals and the address terminal include at least one terminal arrangement in which the data terminals and the address terminal are arranged along two of the sides of the logic chip which contact each other and along one of the corners of the logic chip which contacts the two of the sides of the logic chip.

In the at least one terminal arrangement, the address terminal may be arranged in an address terminal area adjacent to the one of the corners of the logic chip, and the data terminals may be arranged in data terminal areas which are arranged on both sides of the address terminal area and are adjacent to the two of the sides of the logic chip.

The plurality of memory packages may include a double data rate (DDR) memory chip.

The logic chip may be arranged such that the one of the corners of the logic chip is disposed between two of the plurality of memory packages, which are adjacent to each other.

In a further embodiment, a method of fabrication is provided. The method includes: selecting a substrate; and, placing at least one a logic chip and at least one memory package on the substrate, wherein an angular orientation of the logic chip is offset relative to the orientation of the at least one memory package.

The method may further include connecting data lines between first system data terminals of the logic chip and memory data terminals of the at least one memory package. The data lines between the logic chip and a first memory package may be symmetrically arranged with data lines between the logic chip and a second memory package. The logic chip may be offset from the orientation of the at least one memory package by an angular orientation that is between thirty (30) degrees and sixty (60) degrees. The logic chip may include one of: a system-on-chip (SiC), a central processing unit (CPU), a graphics processing unit (GPU), an application processor (AP), a microprocessor, a digital signal processor (DSP), and a microcontroller; and the memory package may include one of: a dynamic random access memory (DRAM), static random access memory (SRAM), phase-change random access memory (PRAM), magnetoresistive random access memory (MRAM), ferroelectric random access memory (FeRAM), resistive random access memory (RRAM), a flash memory, or electrically erasable programmable read-only memory (EEPROM).

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The attached drawings for illustrating exemplary embodiments of the present invention are referred to in order to gain a sufficient understanding of the present invention, the merits thereof, and the objectives accomplished by the implementation of the present invention.

The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

It will be understood that when a component, such as a layer, a film, a region, or a plate, is referred to as being "on" or "connected to" another component, the component can be directly on or connected to the other component or intervening components may be present thereon. When a component is referred to as being "directly on" or "directly connected to" another component, intervening components may not be present thereon. The above expressions may encompass other expressions which describe relations between components, for example, "between", "directly between", or the like.

While such terms as "first", "second", etc., may be used to describe various components, such components must not be limited to the above terms. The above terms are used only to distinguish one component from another. Thus, a first element discussed below could be termed a second element, and similarly, a second element may be termed a first element without departing from the teachings of this disclosure.

An expression used in the singular encompasses the expression of the plural, unless it has a clearly different meaning in the context. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As discussed herein, the term "chip" generally refers to a semiconductor component that may be included in a circuit. For example, a chip may be mounted onto a printed circuit board and connected to other chips. In one example, a first chip includes a logic chip, such as a processor, while other chips may be memory chips connected that are then connected to the logic chip.

Unless otherwise defined, all terms used herein have the same meaning as commonly understood by one of ordinary skill in the art to which this invention belongs.

Hereinafter, the present disclosure will be described in detail by explaining exemplary embodiments of the present inventive concepts with reference to the attached drawings. Like reference numerals in the drawings denote like elements.

FIG. 1 is a plan layout of a semiconductor package 100 according to some exemplary embodiments.

Referring to FIG. 1, the semiconductor package 100 includes a substrate 11, a first memory package 13A and a second memory package 13B, which are arranged on the substrate 11. A logic chip 15-1, which is electrically connected to the first memory package 13A and the second memory package 13B is also arranged on the substrate 11. The logic chip 15-1 may include a plurality of terminals electrically connected to an external device (not shown). The logic chip 15-1 may include a plurality of corners, such as first corner V1 through fourth corner V4 (that is, first corner V1, second corner V2, third corner V3 and fourth corner V4). The logic chip 15-1 may include a plurality of sides, each side disposed between respective corners. In this embodiment, the sides are referenced as first side 17A, second side 17B, third side 17A' and fourth side 17B'. The first corner V1 and the second corner V2 are opposing and face each other, while the third corner V3 and the fourth corner V4 are opposing and face each other. The first corner V1 may contact the first side 17A and the second side 17B. The second corner V2 may contact the third side 17A' and the fourth side 17B'. The third corner V3 may contact the first side 17A and the third side 17A'. The fourth corner V4 may contact the second side 17B and the fourth side 17B'. The terminals may be arranged along at least a portion of the first side 17A and at least a portion of the second side 17B, which contact the first corner V1 of the logic chip 15-1, and may form a terminal arrangement 19. The terminals included in the terminal arrangement 19 may include a first system address terminal 21A, a second system address terminal 21B, first system data terminals 23A, and second system data terminals 23B.

Each arrangement of system data terminals includes a plurality of terminals. In the example of FIG. 1, each of the first system data terminals 23A, and the second system data terminals 23B include eight (8) individual terminals.

First memory package 13A may include first memory chip 13A-3, while second memory package 13B may include second memory chip 13B-3. Other components may be included in first memory package 13A and second memory package 13B.

Figure 3:
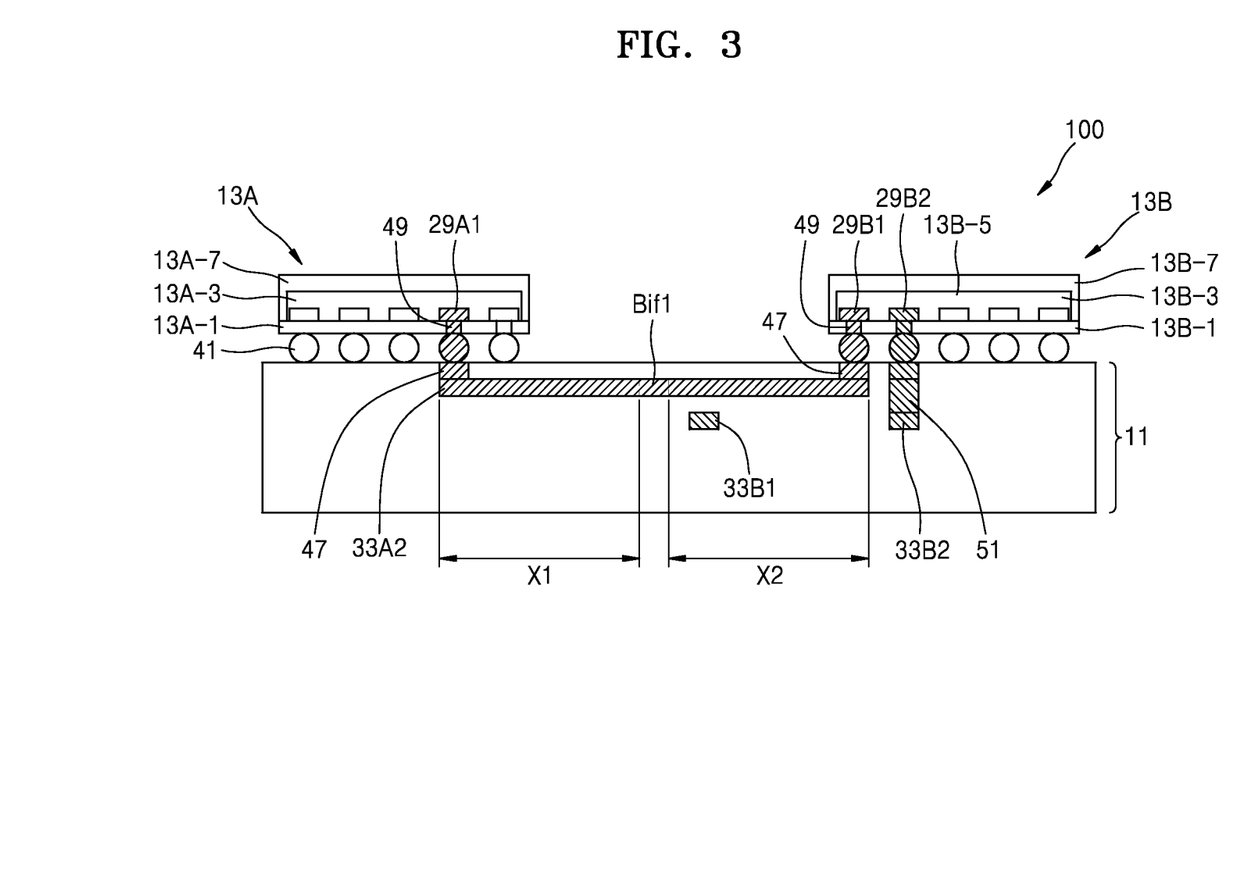
FIG. 3 is a cross-sectional view taken along a line B-B' of FIG. 1 in order to illustrate address lines.

When data for the logic chip 15-1 is read from at least one of the memory chips (such as first memory chip 13A-3 and second memory chip 13B-3, shown in FIG. 3), or when the data from the logic chip 15-1 is stored in at least one of the memory chips, address signals may be transmitted between the logic chip 15-1 and the respective memory chip (such as the first memory chip 13A-3 and the second memory chip 13B3). Data signals, such as those corresponding to the address signals, may be input/output through the first system data terminals 23A and the second system data terminals 23B.

The first system address terminals 21A and the second system address terminals 21B may be arranged in a system address terminal area 25, shown as being adjacent to the first corner V1 of the logic chip 15-1. In this example, the number of system address terminals which are arranged in the system address terminal area 25 is two, but the number thereof is not limited thereto. Therefore, one or more system address terminals may be arranged in the system address terminal area 25.

The first system data terminals 23A may be arranged in a first system data terminal area 27A adjacent to the first side 17A, and the second system data terminals 23B may be arranged in a second system data terminal area 27B adjacent to the second side 17B. Accordingly, the first system data terminal area 27A and the second system data terminal area 27B, which are_adjacent to the first side 17A and the second side 17B, respectively, may be symmetrically arranged about the system address terminal area 25, which is adjacent to the first corner V1.

Though the number of terminals in each of the system data terminals 23A the second system data terminals 23B is shown as eight (8), the number of terminals within the first system data terminals 23A and the second system data terminals 23B is not limited thereto. In some embodiments, 16, 24, 32, or more terminals may be contained in at least one of the first system data terminals 23A and the second system data terminals 23B.

The first memory package 13A may be adjacent to the first system data terminal area 27A, and the second memory package 13B may be adjacent to the second system data terminal area 27B. In this case, the first corner V1 of the logic chip 15-1 is arranged between the first memory package 13A and the second memory package 13B. The arrangement may decrease respective gaps between the first system data terminal area 27A and the first memory package 13A as well as between the second system data terminal area 27B and the second memory package 13B. For example, the decrease may be realized, in embodiments where the first system data terminal area 27A, the first memory package 13A, the second system data terminal area 27B, and the second memory package 13B are arranged on both sides of the logic chip 15-1 relative to the first corner V1. Accordingly, a line length of interconnection between the logic chip 15-1 and each of the first memory package 13A and the second memory package 13B may decrease.

In some embodiments, the first memory package 13A and the second memory package 13B may include four corners and four sides extending between the corners. The relative direction of each side of the first memory package 13A and the second memory package 13B may differ from the direction of each side of the logic chip 15-1 (that is, the first side 17A, the second side 17B, the third side 17A' and the fourth side 17W). That is, the respective sides of the first memory package 13A and the second memory package 13B may be arranged at a predetermined angle from correlating sides of the logic chip 15-1. For example, in one embodiment, a first side of the first memory package 13A may extend in a direction that is offset forty five (45) degrees from a direction in which the first side 17A of the logic chip 15-1 extends. The angular offset may be referred to as an "offset angle" or as an "angle of orientation" or as an "angle of relative orientation" and by other similar terms. Each one of the first memory package 13A and the second memory package 13B may be oriented at an offset angle that is deemed appropriate. In some embodiments, the offset angle between the logic chip and at least one memory package ranges between thirty (30) degrees and sixty (60) degrees.

In the example of FIG. 1, the logic chip 15-1 is rhombus-shaped and is arranged adjacent to the first memory package 13A and the second memory package 13B. The logic chip 15-1 and the first memory package 13A and the second memory package 13B are arranged in the above-described manner, and thus, an entire area of the semiconductor package 100 is decreased. As a result, terminals of the logic chip 15-1 are arranged so that respective line lengths of the interconnections between the logic chip 15-1 and the first memory package 13A and the second memory package 13B may be decreased. As the line lengths of the interconnections are decreased, data processing speed is increased. Thus, performance of the semiconductor package 100 is improved over the prior art.

The first memory package 13A may include first memory address terminals 29A1 and second memory address terminal 29A2. The logic chip 15-1 transmits data address signals to the first memory address terminals 29A1 and the second memory address terminals 29A2. The first memory package 13A may also include first memory data terminals 31A via which the data signals that are input/output by the logic chip 15-1 pass. Similarly, the second memory package 13B may include first memory address terminals 29B1 and second memory address terminals 29B2. The logic chip 15-1 transmits data address signals to the first memory address terminals 29B1 and the second memory address terminals 29B2. The second memory package 13B may also include second memory data terminals 31B via which the data signals that are input/output by the logic chip 15-1 pass.

In some embodiments, the first memory data terminals 31A of the first memory package 13A and the first memory address terminals 29A1 and the second memory address terminals 29A2 may respectively be memory data terminals and address terminals of the first memory chip 13A-3 (refer to FIG. 2) of the first memory package 13A. In addition, the second memory data terminals 31B included in the second memory package 13B and the first and second memory address terminals 29B1 and 29B2 may respectively be data terminals and address terminals of the second memory chip 13B-3 (refer to FIG. 2) included in the second memory package 13B.

The first system address terminals 21A and the second system address terminals 21B as well as the first and memory address terminals 29A1, 29A2 and the second memory address terminals 29B1 and 29B2 may be connected through a first address line 33A and a second address line 33B, respectively. The first system address terminals 21A may be connected to the first memory address terminal 29A1 of the first memory package 13A and the first memory address terminal 29B1 of the second memory package 13B through the first address line 33A. The second system address terminal 21B may be connected to the second memory address terminal 29A2 of the first memory package 13A and the second memory address terminal 29B2 of the second memory package 13B through the second address line 33B.

In some embodiments, the first address line 33A may include a common line 33A1. Common line 33A1 is connected to the first system address terminal 21A and a branch line 33A2. The branch line 33A2 branches from the common line 33A1 and is connected to the first memory address terminals 29A1 and 29B1 of the first memory package 13A and the second memory package 13B. The second address line 33B may include common line 33B1. Common line 33B1 is connected to the second system address terminal 21B and a branch line 33B2. Branch line 33B2 branches from the common line 33B1 and is connected to the second memory address terminals 29A2 and 29B2 of the first memory package 13A and the second memory package 13B. In this example, the common line 33B1 and the branch line 33B2 may branch from node Bif1 and node Bif2. Node Bif1 and node Bif2 are respectively arranged on a center of a distance between the first memory address terminals 29A1 and 29B1 and a center of a distance between the second memory address terminals 29A2 and 29B2. Accordingly, a line length X1 from the node Bif1 to the first memory address terminal 29A1 of the first memory package 13A may be the same as a line length X2 from the node Bif1 to the first memory address terminal 29B1 of the second memory package 13B. Similarly, a line length from the node Bif2 to the second memory address terminal 29A2 of the first memory package 13A may be the same as a line length from the node Bif2 to the second memory address terminal 29B2 of the second memory package 13B.

FIG. 1 shows that the first memory address terminals 29A1, 29A2 and the second memory address terminals 29B1 and 29B2 as well as the first memory data terminals 31A and the second memory data terminals 31B are formed on edges of the first memory package 13A and the second memory package 13B. However, the arrangement shown is not limiting. For example, the first memory data terminals 31A and the second memory data terminals 31B may be respectively arranged at centers of the first memory package 13A and the second memory package 13B.

First data lines 35A, which connect the first system data terminals 23A and the first memory data terminals 31A, and second data lines 35B, which connect the second system data terminals 23B and the second memory data terminals 31B, may be symmetrically formed about a line vertically extending between a center of a distance between the first memory package 13A and the second memory package 13B. Accordingly, a length Y1 of each of the first data lines 35A may be the same as a length Y2 of each of the second data lines 35B, which symmetrically correspond to the first data lines 35A. Alternatively, an average length of the first data lines 35A may be the same as that of the second data lines 35B. Alternatively, a sum of the lengths Y1 of the first data lines 35A may be the same as that of the lengths Y2 of the second data lines 35B.

In some embodiments, the logic chip 15-1 and terminals included in the first memory package 23A and the second memory package 23B may face the substrate 11. Accordingly, the logic chip 15-1 may be bonded to the substrate 11 by flip-chip bonding. Therefore, the first system address terminals 21A and the second system address terminals 21B as well as the first system data terminals 23A and the second system data terminals 23B may be directly connected to terminals formed on the substrate 11. The first system address terminals 21A and the second system address terminals 21B as well as the first system data terminals 23A and the second system data terminals 23B may each be electrically connected to the first memory address terminals 29A1, 29B1 and the second memory address terminals 29A2 and 29B2 as well as the first memory data terminals 31A and the second memory data terminals 31B by using a circuit line pattern. A detailed description thereof will be provided with reference to FIG. 2 through FIG. 4.

The logic chip 15-1 may be a system-on-chip (SiC). For example, the logic chip 15-1 may include a central processing unit (CPU), a graphics processing unit (GPU), an application processor (AP), a microprocessor, a digital signal processor (DSP), or a microcontroller. In addition, the logic chip 15-1 may include all types of non-memory semiconductor devices. Also, a memory device may be included in the logic chip 15-1.

The first memory package 13A and the second memory package 13B may include a memory semiconductor chip such as dynamic random access memory (DRAM), static random access memory (SRAM), phase-change random access memory (PRAM), magnetoresistive random access memory (MRAM), ferroelectric random access memory (FeRAM), resistive random access memory (RRAM), a flash memory, or electrically erasable programmable read-only memory (EEPROM).

The first memory package 13A and the second memory package 13B may include a double data rate (DDR) memory chip, but are not limited thereto. In some embodiments, the first memory package 13A and the second memory package 13B may perform data transmission methods, for example, a single data rate (SDR) method, a quad data rate (QDR) method, or more. In some embodiments, the first memory package 13A and the second memory package 13B may perform a low power double data rate (LPDDR) method.

Figure 2:
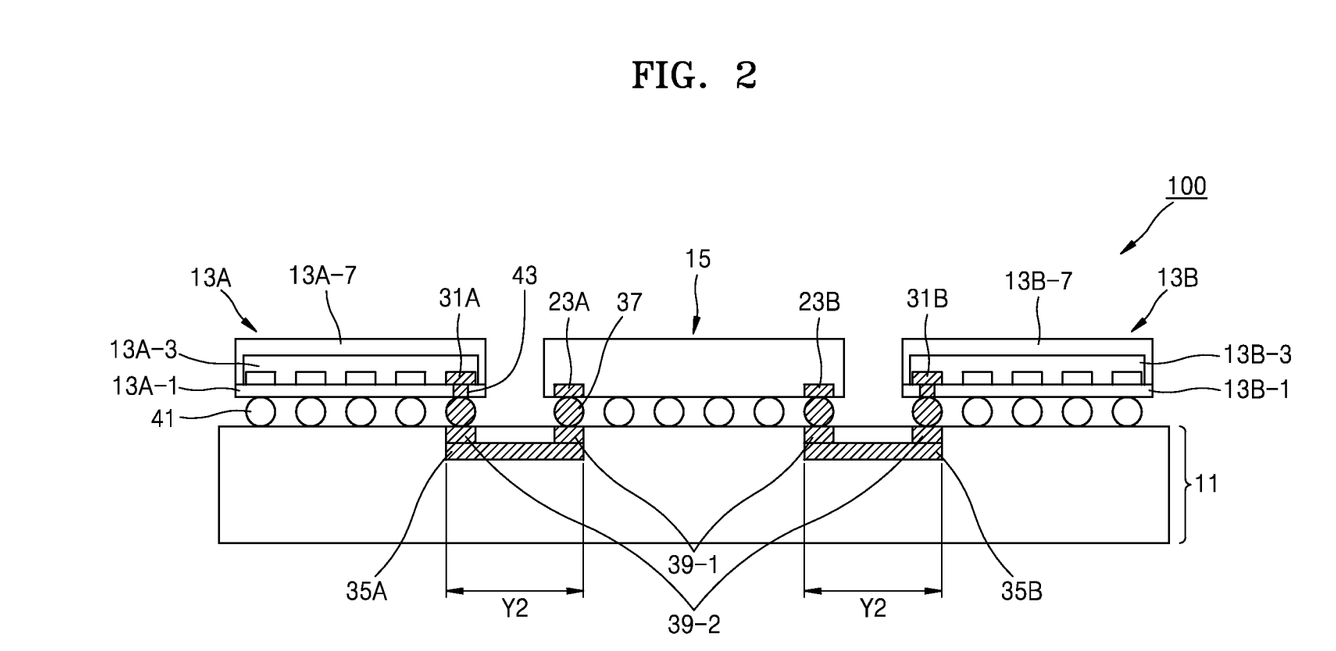
FIG. 2 is a cross-sectional view taken along a line A-A' of FIG. 1 in order to illustrate data lines.

FIG. 2 is a cross-sectional view of the semiconductor package 100, taken along a line A-A' of FIG. 1 in order to illustrate data lines.

Referring to FIG. 2, the logic chip 15-1 is connected to each of the first memory package 13A and the second memory package 13B formed on the substrate 11 via the first data lines 35A and the second data lines 35B.

In detail, the substrate 11 is a support substrate in which the logic chip 15-1 and the first memory package 13A and the second memory package 13B are mounted. The substrate 11 may include a multilayer line structure in an insulating base. The logic chip 15-1 may be electrically connected to first substrate data terminals 39-1, which are exposed on a surface of the substrate 11. The connection may be via first connection members 37, for example, bumps. The first data lines 35A and the second data lines 35B are respectively arranged below the first memory package 13A and the second memory package 13B and are electrically connected to second substrate data terminals 39-2 exposed on the surface of the substrate 11. The second substrate data terminals 39-2 may be electrically connected to the first memory package 13A and the second memory package 13B, respectively, via second connection members 41. Second connection members may be, for example, solder balls. In detail, electrical signals transmitted via the second connection members 41 may be transmitted to the first memory data terminals 31A and the second memory data terminals 31B via first circuit lines 43. The first circuit lines 43 are respectively formed on memory chips 13A-1 and 13B-1 of the first memory package 13A and second memory package 13B. Data signals may be transmitted to the first memory chip 13A-3 and the second memory chip 13B-3 via the first memory data terminals 31A and the second memory data terminals 31B. The first memory chip 13A-3 and the second memory chip 13B-3 may be sealed by a first sealing member 13A-7 and second sealing member 13B-7. The first data line 35A and the second data line 35B may be formed of conductive materials. Also, although not illustrated in FIG. 2, other than the first data line 35A and the second data line 35B, the substrate 11 may further include a line structure.

As described above, the first data lines 35A and the second data lines 35B may be symmetrically formed about a central vertical line between the first memory package 13A and the second memory package 13B. Accordingly, the length Y1 of each of the first data lines 35A may be the same as the length Y2 of each of the second data lines 35B, which symmetrically correspond to the first data lines 35A.

FIG. 2 shows that the logic chip 15-1 is electrically connected to the substrate 11 by flip-chip bonding, but the inventive concept is not limited thereto.

Although not illustrated in FIG. 2, external connection members may be arranged on a lower surface of the substrate 11 which faces an upper surface of the substrate 11 to which the logic chip 15-1 and the first memory package 13A and the second memory package 13B are mounted. The substrate 11 may be mounted on a module substrate or a system board via the external connection members. Also, although not illustrated in FIG. 2, respective gaps between the upper surface of the substrate 11 and the logic chip 15-1 and between the upper surface of the substrate 11 and the first memory package 13A and the second memory package 13B may be sealed by sealing resin.

The substrate 11 may be formed as on a printed circuit board (PCB), a ceramic substrate, a glass substrate, an interposer substrate, etc. Also, the substrate 11 may be formed as an active wafer, for example, a silicon wafer, in which a semiconductor chip is formed.

FIG. 3 is a cross-sectional view of the semiconductor package 100, taken along a line B-B' of FIG. 1 in order to illustrate address lines.

Referring to FIG. 3, the logic chip 15-1 of FIG. 1, which is not shown, is connected to each of the first memory package 13A and the second memory package 13B via the first address line 33A formed on the substrate 11.

Referring to FIGS. 1 and 3, the logic chip 15-1 may be electrically connected to a substrate address terminal (not shown) formed on the substrate 11 via connection members (not shown) formed on a lower surface of the logic chip 15-1. The substrate address terminal may be connected to the first address line 33A. The first address line 33A extends toward the common line 33A1 and may be electrically connected to each of the first memory package 13A and the second memory package 13B via the branch line 33A2 branching from the node Bif1. Referring back to FIG. 3, the branch line 33A2 of the first address line 33A may be electrically connected to each substrate address terminal 47 formed in the substrate 11 that is arranged on lower surfaces of the first memory package 13A and the second memory package 13B. The substrate address terminals 47 may be electrically connected to the first memory package 13A and the second memory package 13B via the connection members 41 formed on the substrate 11, for example, the solder balls. The first memory package 13A and the second memory package 13B may be connected to the first memory address terminals 29A1 and the second memory address terminals 29B1 via second circuit lines 49, which are respectively formed in the memory substrates 13A-1 and 13B-1 of the first memory package 13A and the second memory package 13B.

The substrate 11 may have a plurality of lines including the first address lines 33A and the second address lines 33B and may have a multilayer line structure in order to prevent a short circuit of the lines. A cross-section of the common line 33B1 of the second address line 33B is shown below the branch line 33A2. Also, a substrate through via 51, which penetrates an inside of the substrate 11, may be arranged to electrically connect the substrate address terminals 47 to the second address line 33B.

As described with reference to FIG. 1, the length X1 of the branch line 33A2, which extends from the node Bif1 to the first memory address terminal 29A1 of the first memory package 13A, may be substantially the same as the length X2 of the branch line 33A2, which extends from the node Bif1 to the second memory address terminal 29B 1 of the second memory package 13B.

Figure 4:
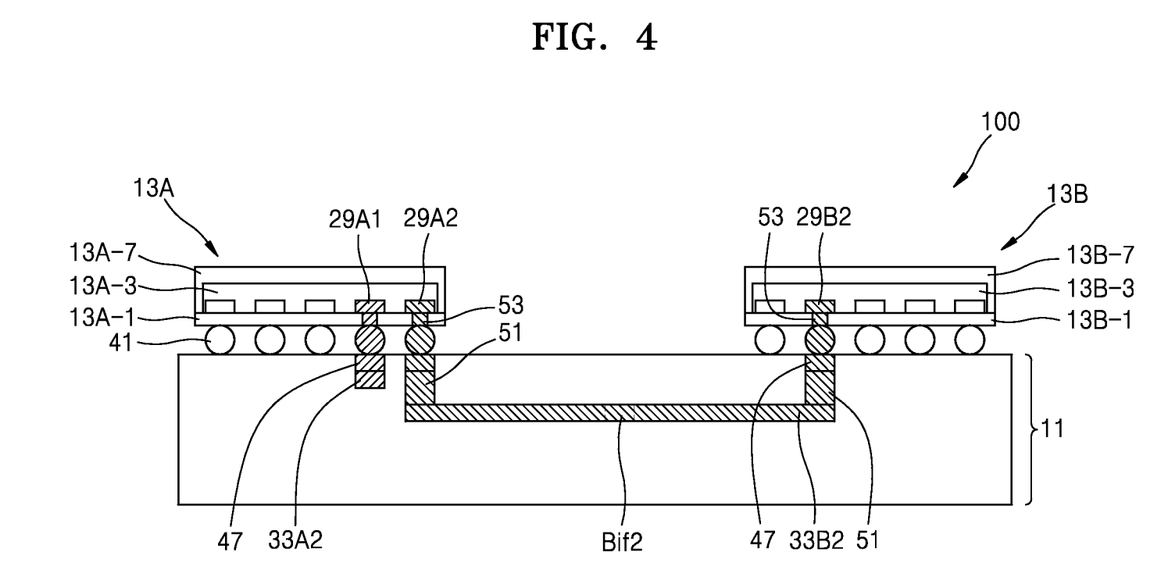
FIG. 4 is a cross-sectional view taken along a line C-C' of FIG. 1 in order to illustrate address lines.

FIG. 4 is a cross-sectional view of the semiconductor package 100, taken along a line C-C' of FIG. 1 in order to illustrate address lines.

Referring to FIG. 4, like the first address line 33A of FIG. 2 that is formed in the substrate 11, the second address line 33B may be formed in the substrate 11. The first address line 33A and the second address line 33B may be insulated from each other in order to prevent a short circuit therebetween.

The branch line 33B2 of the second address line 33B may be electrically connected to each of the substrate address terminals 47, which are exposed on the surface of the substrate 11, via the substrate through vias 51. The substrate address terminals 47 may be electrically connected to the first memory package 13A and the second memory package 13B via the second connection members 41 formed on the substrate 11. The second connection members 41 may include, for example, solder balls.

Arrangements of the first memory address terminals 29A1, 29B1 and the second memory address terminals 29A2, and 29B2 may be adjusted such that distances between node Bif1 and node Bif2 and the first memory address terminals 29A1 and 29B1 of the first memory package 13A and the second memory package 13B are the same as distances between node Bif1 and node Bif2 and the second memory address terminals 29A2 and 29B2.

Figure 5:
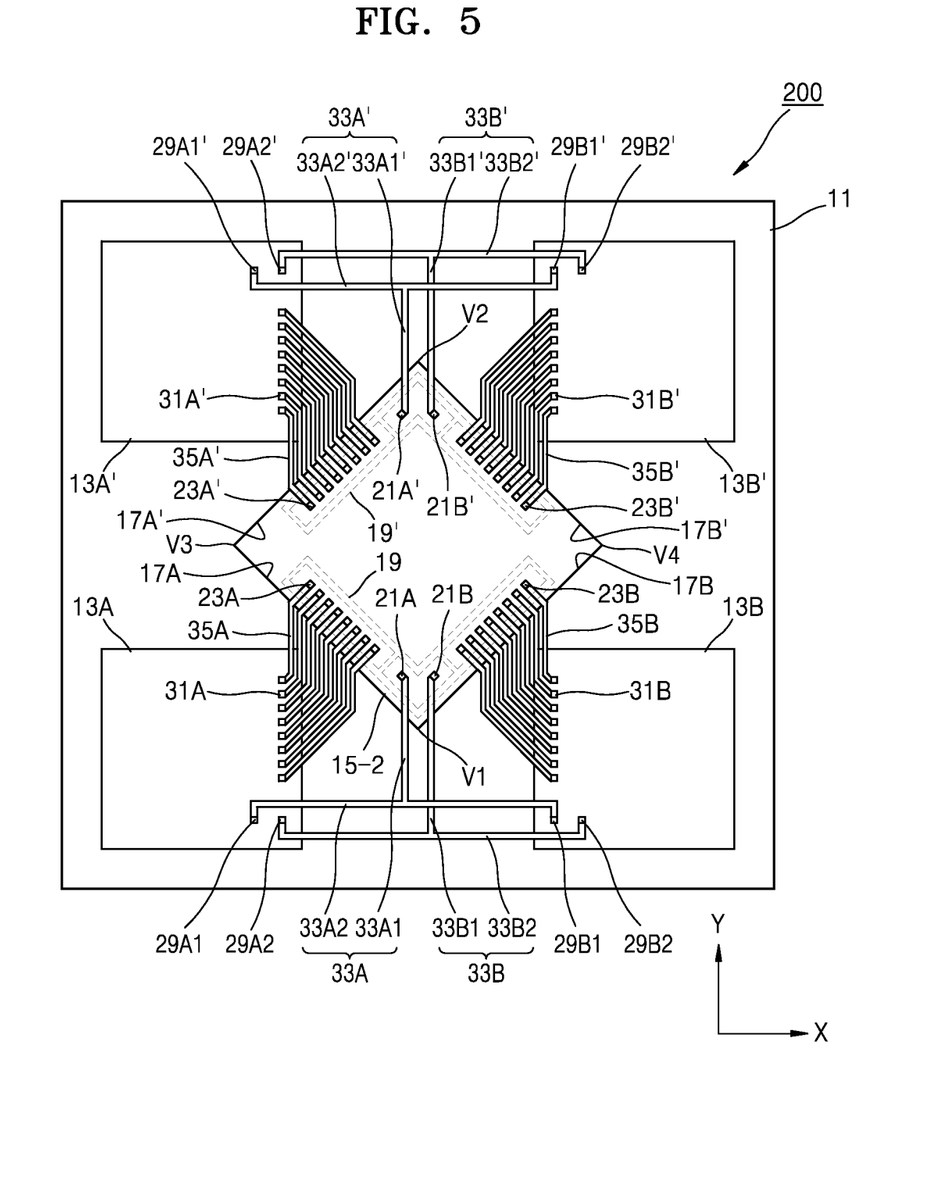
FIGS. 5 and 6 are plan layouts of semiconductor packages according to some exemplary embodiments.

FIG. 5 is a plan layout of a semiconductor package 200 according to another exemplary embodiment. For convenience, the terminal arrangement 19 of FIG. 1 will be referred to as a first terminal arrangement 19.

FIG. 5 shows the semiconductor package 200 which includes the first terminal arrangement 19 included in the semiconductor package 100 of FIG. 1 and further includes a second terminal arrangement 19' which is similar to the first terminal arrangement 19.

Terminals are arranged along at least a portion of a third side 17A', which contacts a second corner V2 that is different from the first corner V1 of FIG. 1 from among first through fourth corners (V1-V4) of a logic chip 15-2, and at least a portion of a fourth side 17B'. Thus, the second terminal arrangement 19' may be formed. In detail, third system address terminals 21A' and the fourth system address terminals 21B' are arranged in an area adjacent to the second corner V2, and third system data terminals 23A' and the fourth system data terminals 23B' may be arranged in an area adjacent to the third side 17A' and the fourth side and 17B'. A third memory package 13A' and a fourth memory package 13B' may be respectively arranged to be adjacent to the third side 17A' and the fourth side 17B' of the logic chip 15-2. In this case, first memory package 13A through the fourth memory package 13B' (that is, memory packages 13A, 13B, 13A', and 13B') may be arranged in a matrix form. The logic chip 15-2 may be arranged such that the second corner V2 may be disposed between the third memory package 13A' and the fourth memory package 13W. For example, the logic chip 15-2 may be rhombus-shaped. The above arrangement may decrease an entire area of the semiconductor package 200, in comparison to an arrangement in which the first memory package through the fourth memory package (memory packages 13A, 13B, 13A', and 13W) and the logic chip 15-2 are arranged in parallel. As described above, as terminals of the logic chip 15-2 are arranged in a certain manner, a line length of interconnection between the logic chip 15-2 and the first through fourth memory packages (13A, 13B, 13A', and 13W) may be decreased. As the line length is decreased, data processing speed is increased, and thus, performance of the semiconductor package 200 is improved.

Figure 6:
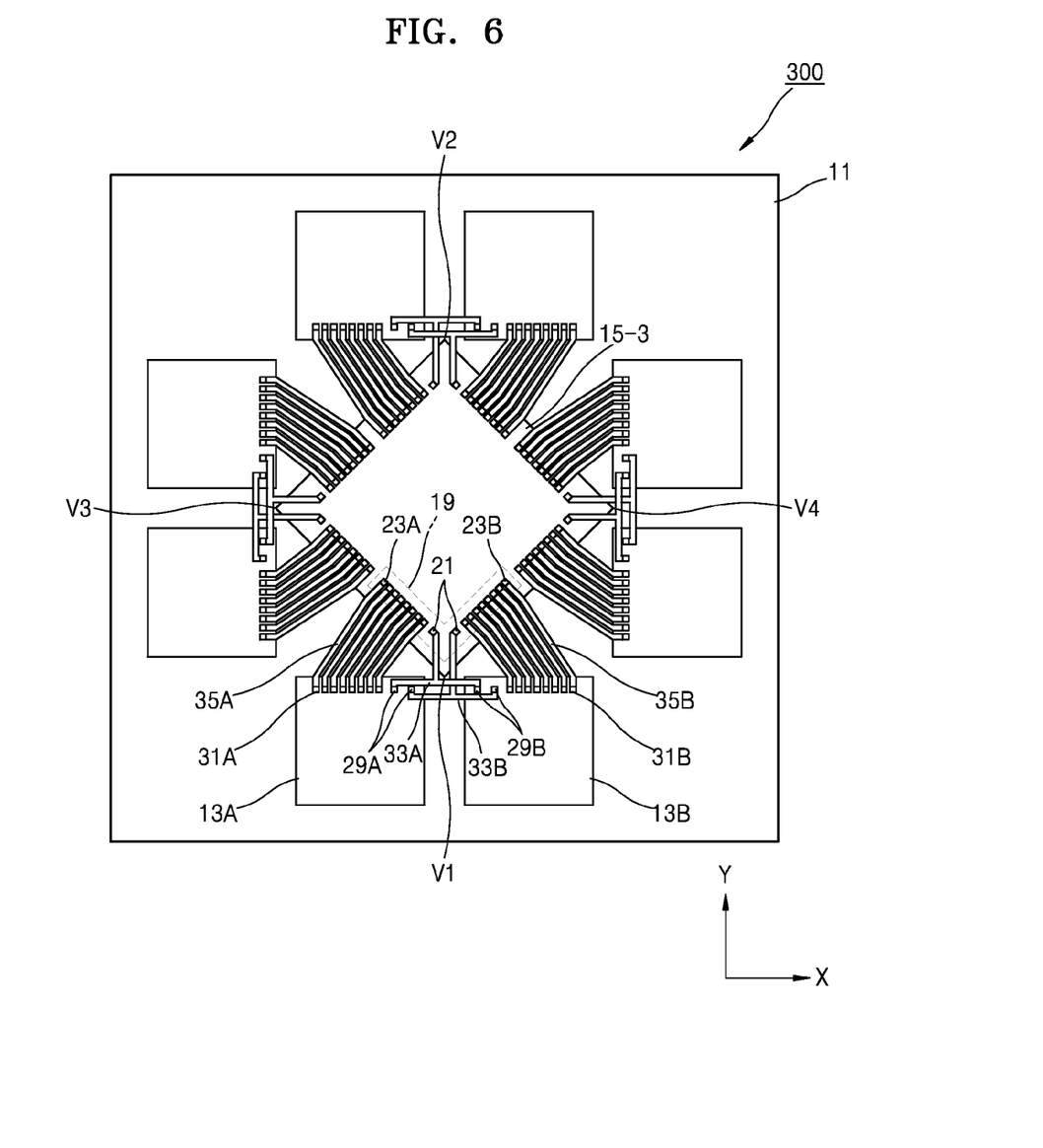

FIG. 6 is a plan layout of a semiconductor package 300 according to another exemplary embodiment.

Referring to FIG. 6, a logic chip 15-3 included in the semiconductor package 300 may include four terminal arrangements 19 which are described with reference to FIG. 1. The terminal arrangements 19 may be arranged in a similar manner, based on each center of first corner V1 through fourth corner V4. Accordingly, the semiconductor package 300 includes four pairs of first memory packages 13A and second memory packages 13B. The first memory package 13A and the second memory package 13B are arranged in neighboring areas of the substrate 11 at sides of the logic chip 15-3, and the logic chip 15-3 may be arranged on a center of the substrate 11.

The number of terminal arrangements 19 in FIG. 5 and FIG. 6 is two and four, respectively, but the inventive concept is not limited thereto. The number of terminal arrangements 19 included in the logic chip 15-3 is not limited thereof and may differ in other embodiments. Also, another terminal arrangement, other than the terminal arrangement 19, may be further included.

Figure 7A:
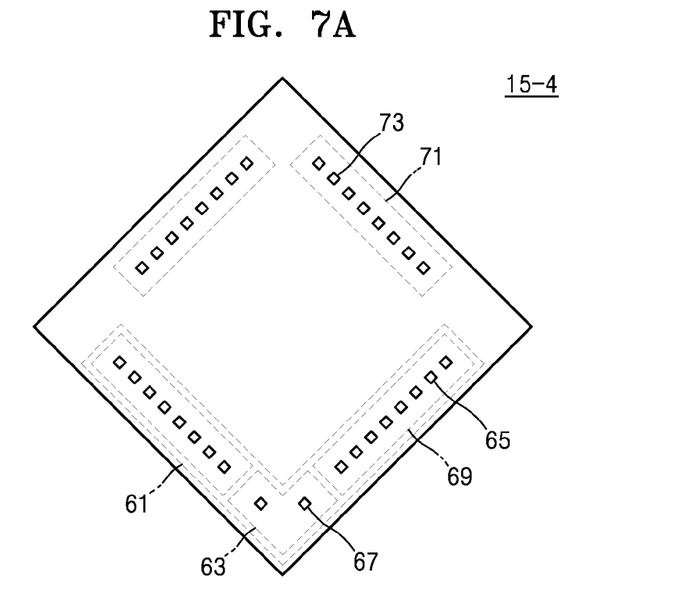
FIGS. 7A and 7B are plan layouts of logic chips according to some exemplary embodiments.
Figure 7B:
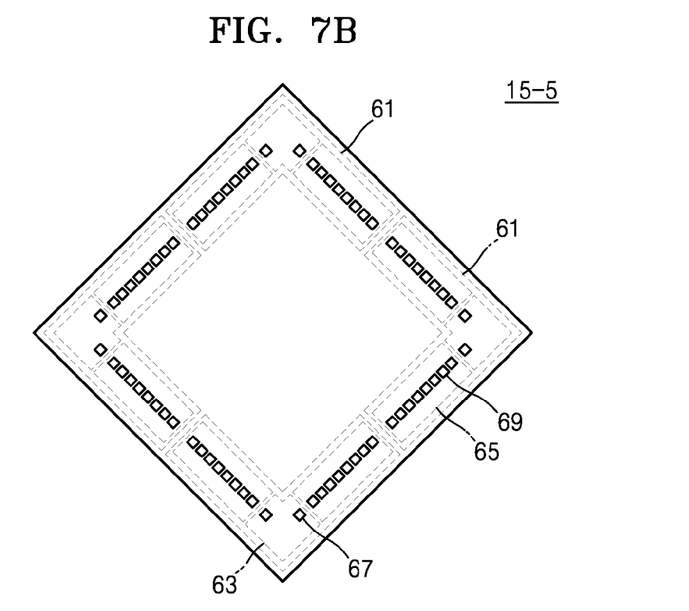

FIG. 7A and FIG. 7B are plan layouts of logic chip 15-4 and logic chip 15-5 according to some exemplary embodiments.

Referring to FIG. 7A, the logic chip 15-4 may have a first terminal arrangement 61 which includes data terminals 65, via which signals inputting/outputting data pass, and address terminals 67 via which signals designating addresses of data pass. The data terminals 65 may be arranged in a data terminal area 69. The address terminals 67 may be arranged in an address terminal area 63 adjacent to a corner of the logic chip 15-4.

In addition to the first terminal arrangement 61, the logic chip 15-4 may further include terminals 73 having a second terminal arrangement 71, which is different from the first terminal arrangement 61. The second terminal arrangement 71 may be arranged on sides facing sides on which the first terminal arrangement 61 is arranged.

Referring to FIG. 7B, the logic chip 15-5 may include four first terminal arrangements 61 as included in the logic chip 15-4 of FIG. 7A. The first terminal arrangements 61 may be arranged respectively on corners of the logic chip 15-5. The inventive concept may include a logic chip in which the terminal arrangement 61 is formed on at least one corner of the logic chip and a logic chip which further includes a terminal arrangement that is different from the terminal arrangement 61 shown.

The terminals formed in the logic chips 15-4 and 15-5 of FIGS. 7A and 7B may be electrically connected to any device such as a memory chip, a memory package, a non-memory chip, or a non-memory package.

Figure 8:
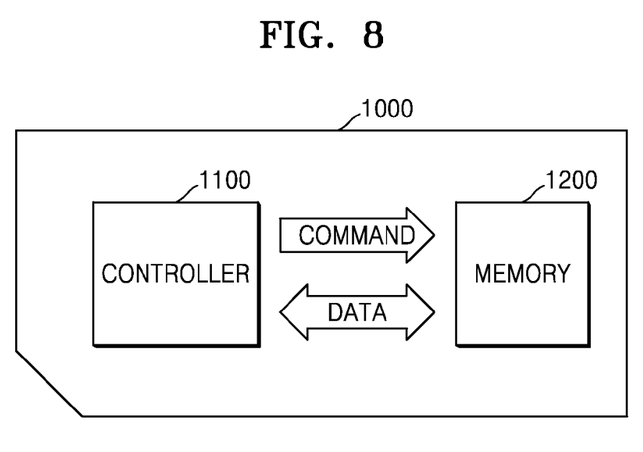
FIG. 8 is a block diagram of a memory system including a semiconductor package, according to some exemplary embodiments.

FIG. 8 is a block diagram of a memory system 1000 including a semiconductor package, according to some exemplary embodiments.

Referring to FIG. 8, a controller 1100 and a memory 1200 may be arranged to exchange electrical signals with each other in the memory system 1000. For example, when the controller 1100 transmits a command, the memory 1200 may transmit data. The controller 1100 and/or the memory 1200 may include the semiconductor packages 100, 200 and 300 and the logic chips 15-1 through according to one or more exemplary embodiments. The memory 1200 may include a memory array (not shown) or a memory array bank (not shown).

The memory system 1000 may include a memory card or a solid state drive (SSD).

Figure 9:
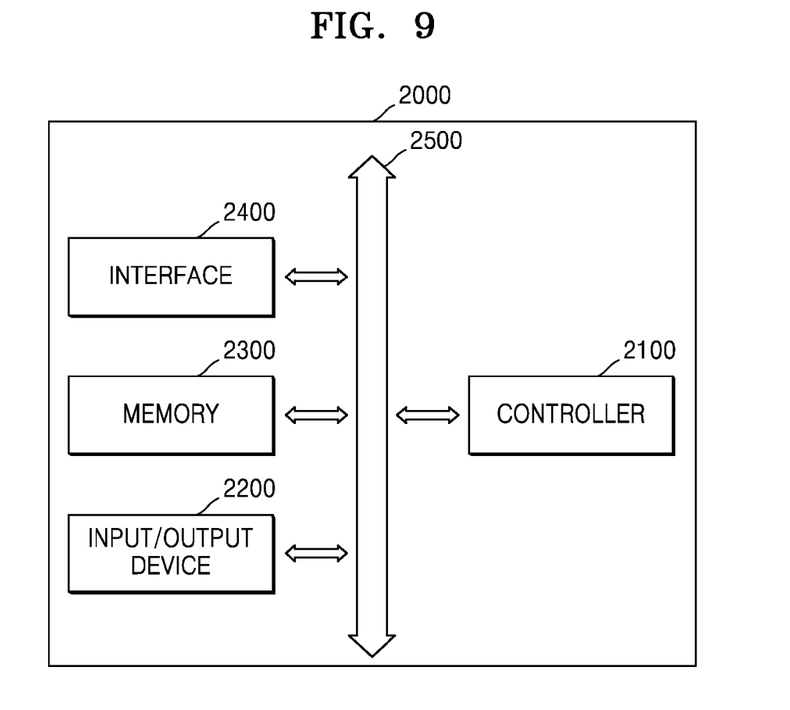
FIG. 9 is a block diagram of an electronic system including a semiconductor package, according to some exemplary embodiments.

FIG. 9 is a block diagram of an electronic system 2000 including a semiconductor package, according to some exemplary embodiments.

Referring to FIG. 9, the electronic system 2000 may include a controller 2100, an input/output device 2200, a memory 2300, and an interface 2400. The electronic system 2000 may be a mobile system or a system which transmits or receive information. The mobile system may be a PDA, a portable computer, a web tablet, a wireless phone, a mobile phone, or a digital music player.

The controller 2100 may execute programs and control the electronic system 2000. The controller 2100 may be, for example, a microprocessor, a digital signal processor, a microcontroller, or a device similar thereto. The input/output device 2200 may be used to input or output data of the electronic system 2000.

The electronic system 2000 is connected to an external device such as a personal computer (PC) or a network by using the input/output device 2200 and may exchange data with the external device. The input/output device 2200 may be, for example, a keypad, a keyboard, or a display. The memory 2300 may store codes for operations of the controller 2100 and/or data, or may store data processed by the controller 2100. The controller 2100 and/or memory 2300 may include the semiconductor packages 100, 200, and 300 and the logic chips 15-1 through 15-5. The interface 2400 may be a data transmission path between the electronic system 2000 and another device. The controller 2100, the input/output device 2200, the memory 2300, and the interface 2400 may communicate with each other via a bus 2500.

As discussed herein, a "rhombus" is a flat shape with four equal straight sides and four corners. Each side is disposed between two of the respective corners. Opposite sides are parallel, and angles of opposite corners are equal. The diagonals of a rhombus bisect each other at right angles. A rhombus with right angles is a square. As discussed herein, the logic chip may exhibit a rhombus shape. In this context, the logic chip may include a first corner adjacent to a first side, the first side terminating in a second corner, the second corner adjacent to a second side, the second side terminating in a third corner, the third corner adjacent to a third side, the third side terminating in a fourth corner, the fourth corner adjacent to an end of the first side that opposes the first corner.

As discussed herein, the term "exemplary" is not meant to imply a superlative. Rather, the term "exemplary" merely refers to one of many possible embodiments.

While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
   a plurality of memory packages that are arranged on a substrate; and
   a logic chip, comprising a rhombus shape arranged adjacent to the plurality of memory packages, the logic chip comprising a plurality of terminals that are electrically connected to the plurality of memory packages;
   wherein:
      the plurality of terminals comprise system address terminals, which are adjacent to a first corner of the logic chip formed by a first side and a second side of the logic chip, and first and second system data terminals, which are respectively arranged on the first side and the second side of the logic chip;
      the plurality of memory packages comprises first and second memory packages;
      the first system data terminals are electrically connected to the first memory package;
      the second system data terminals are electrically connected to the second memory package; and
      each of the first and second memory packages is electrically connected to the system address terminals adjacent to the first corner of the logic chip.

2. The semiconductor package of claim 1, wherein the system address terminals are arranged in a first system address terminal area adjacent to the first corner of the logic chip,
   the first system data terminals are arranged in a first system data terminal area adjacent to the first side, and
   the second system data terminals are arranged in a second system data terminal area adjacent to the second side.

3. The semiconductor package of claim 2, wherein each of the first and second memory packages comprises first and second memory address terminals and memory data terminals.

4. The semiconductor package of claim 3, wherein the first memory package is adjacent to the first system data terminal area of the logic chip, the second memory package is adjacent to the second system data terminal area of the logic chip, and
   the logic chip is arranged such that the first corner of the logic chip is disposed between the first memory package and the second memory package.

5. The semiconductor package of claim 3, wherein the system address terminals of the logic chip comprise a first system address terminal and a second system address terminal and the semiconductor package further comprises:
   a first address line, which connects the first system address terminal to the first memory address terminal of the first memory package and the first memory address terminal of the second memory package; and
   a second address line, which connects the second system address terminal to the second memory address terminal of the first memory package and the second memory address terminal of the second memory package.

6. The semiconductor package of claim 5, wherein each of the first and second address lines is arranged in the substrate and comprises a common line, which is connected to each of the first and second system address terminals, and branch lines, which branch from each common line and extend toward the first and second memory packages.

7. The semiconductor package of claim 5, wherein a length of the first address line is substantially the same as that of the second address line.

8. The semiconductor package of claim 3, comprising first data lines, which connect the first system data terminals and the memory data terminals of the first memory package, and second data lines, which connect the second system data terminals and the memory data terminals of the second memory package, wherein the first data lines and the second data lines are symmetrically arranged about a center of a distance between the first and second memory packages.

9. The semiconductor package of claim 8, wherein a length of each first data line is the same as that of each second data line, which symmetrically corresponds to each first data line.

10. The semiconductor package of claim 3, further comprising:
    a second system address terminal area, which comprises third system address terminals and fourth system address terminals adjacent to a second corner of the logic chip, wherein the second corner faces the first corner and contacts a third side and a fourth side of the logic chip;
    a third system data terminal area, which comprises third system data terminals arranged adjacent to the third side; and
    a fourth system data terminal area, which comprises fourth system data terminals arranged adjacent to the fourth side.

11. The semiconductor package of claim 10, wherein the plurality of memory packages further comprise third and fourth memory packages, which face the first and second memory packages and are arranged on the substrate, and
    the logic chip is arranged such that the second corner of the logic chip is disposed between the third and fourth memory packages.

12. A semiconductor package comprising:
    a substrate;
    a plurality of memory packages, which are arranged on the substrate and respectively comprise corners and sides connecting the corners; and
    a logic chip, which is arranged adjacent to the plurality of memory packages on the substrate, comprises corners and sides connecting the corners, and comprises a plurality of terminals that are electrically connected to the plurality of memory packages, wherein:
the sides of the logic chip extend in different directions from directions of the sides of the plurality of memory packages, the plurality of terminals of the logic chip comprise data terminals, via which signals inputting/outputting logic data pass, and an address terminal via which signals designating addresses of the data pass, and the data terminals and the address terminal comprise at least one terminal arrangement in which the data terminals are arranged along two of the sides of the logic chip that contact each other and the address terminal is arranged at one of the corners of the logic chip that contacts the two of the sides of the logic chip the plurality of memory packages comprises first and second memory packages;

data terminals arranged along a first one of the two sides of the logic chip are electrically connected to the first memory package;

data terminals arranged along a second one of the two sides of the logic chip are electrically connected to the second memory package; and each of the first and second memory packages is electrically connected to the address terminal.

13. The semiconductor package of claim 12, wherein in the at least one terminal arrangement, the address terminal is arranged in an address terminal area adjacent to the one of the corners of the logic chip, and the data terminals are arranged in data terminal areas, which are arranged on both sides of the address terminal area and are adjacent to the two of the sides of the logic chip.

14. The semiconductor package of claim 12, wherein the plurality of memory packages comprise a double data rate (DDR) memory chip.

15. The semiconductor package of claim 12, wherein the logic chip is arranged such that the one of the corners of the logic chip is disposed between two of the plurality of memory packages, which are adjacent to each other.

* * * * *